United States Patent
Getty

(10) Patent No.: US 11,348,804 B2
(45) Date of Patent: May 31, 2022

(54) X-RAY SHIELDING DEPOSITION METHOD FOR ELECTRON-BEAM DEPOSITED COATINGS

(71) Applicant: Raytheon Company, Waltham, MA (US)

(72) Inventor: Jonathan Getty, Goleta, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 16/950,138

(22) Filed: Nov. 17, 2020

(65) Prior Publication Data

US 2021/0210358 A1 Jul. 8, 2021

Related U.S. Application Data

(60) Provisional application No. 62/956,541, filed on Jan. 2, 2020.

(51) Int. Cl.
*H01L 21/32* (2006.01)
*H01L 21/3205* (2006.01)
*H01L 23/552* (2006.01)

(52) U.S. Cl.
CPC ...... *H01L 21/32051* (2013.01); *H01L 23/552* (2013.01)

(58) Field of Classification Search
CPC ............. H01L 21/32051; H01L 23/552; H01L 51/0048; H01L 51/0545; H01L 51/0052; H01L 27/14658; H01L 27/14676; B82Y 10/00; B82Y 30/00; B82Y 40/00; C23C 16/04; C23C 16/26; C01B 32/162; Y10S 977/847; Y10S 977/891; Y10T 428/249956; Y10T 428/2975; G03F 1/22
USPC ....................................................... 438/800
See application file for complete search history.

(56) References Cited

U.S. PATENT DOCUMENTS

| | | | |
|---|---|---|---|
| 6,689,674 B2* | 2/2004 | Zhang | B82Y 10/00 438/584 |
| 2009/0162972 A1* | 6/2009 | Xu | H01L 31/022433 438/98 |
| 2011/0132443 A1* | 6/2011 | Schultz-Wittman | H01L 31/022425 136/252 |

(Continued)

FOREIGN PATENT DOCUMENTS

| | | |
|---|---|---|
| JP | S61154032 A | 7/1986 |
| JP | H03194926 A | 8/1991 |

(Continued)

OTHER PUBLICATIONS

International Search Report and Written Opinion for Application No. PCT/US2020/058506; Application Filing Date Nov. 2, 2020; dated Feb. 26, 2021 (14 pages).

*Primary Examiner* — Didarul A Mazumder

(74) *Attorney, Agent, or Firm* — Cantor Colburn LLP

(57) ABSTRACT

A method of fabricating an integrated circuit (IC) includes depositing a photoresist on a semiconductor substrate and patterning the photoresist to expose one or more deposition target areas. The method further includes performing a dual-deposition process that deposits a plurality of layers on the photoresists and on the target areas. A conductive layer among the plurality of conductive layers inhibits X-ray energy so as to prevent damage to the underlying semiconductor substrate.

13 Claims, 3 Drawing Sheets

(56) References Cited

U.S. PATENT DOCUMENTS

2016/0149058 A1   5/2016   Bradley, Jr. et al.
2019/0079226 A1   3/2019   Downing

FOREIGN PATENT DOCUMENTS

JP      H06333815 A   12/1994
JP      2001023928 A   1/2001

* cited by examiner

X-RAY SHIELDING DEPOSITION METHOD FOR ELECTRON-BEAM DEPOSITED COATINGS

DOMESTIC PRIORITY

This application claims priority to U.S. Provisional Application Ser. No. 62/956,541, filed Jan. 2, 2020, the contents of which are incorporated by reference herein in its entirety.

BACKGROUND

The present disclosure relates to semiconductor lithography techniques, and more particularly, to electron-beam deposited coatings.

Semiconductor fabrication typically includes one or more lithography processing steps that involve the patterning, shaping and/or altering of deposited materials onto one or more portions of a semiconductor substrate and/or one or more semiconductor device formed on an underlying substrate. One technique for defining an area of deposition is liftoff photolithography, in which a material is deposited over a patterned layer of photoresist or polymer layer. In this method, deposited materials adhere to the substrate and/or semiconductor device where the photoresist or polymer is not present; the deposited material is subsequently removed (lifted off) from areas where the photoresist or polymer is present.

Another known lithography technique is referred to as a shadow mask-based deposition process or simply "shadow mask deposition. When performing shadow mask deposition, the desired resist material is typically vaporized at a source that is located some distance from the substrate. As the vaporized atoms of the material travel toward the substrate, they pass through a shadow mask that is positioned just in front of the substrate surface and/or semiconductor device. The shadow mask contains openings (i.e., apertures), which are arranged to match the desired pattern for the material on the substrate (in similar fashion to a silk screen or art stencil). As a result, the vaporized atoms pass only through the apertures and are deposited on the substrate surface and/or the semiconductor device.

SUMMARY

According to a non-limiting embodiment, a method of fabricating an integrated circuit (IC) includes depositing a photoresist on a semiconductor substrate and patterning the photoresist to expose one or more deposition target areas. The method further includes performing a dual-deposition process that deposits a plurality of layers on the photoresists and on the target areas. A conductive layer among the plurality of conductive layers inhibits X-ray energy so as to prevent damage to the underlying semiconductor substrate.

According to another non-limiting embodiment, a method of fabricating an integrated circuit (IC) comprises depositing a photoresist on a semiconductor substrate, and patterning the photoresist to expose one or more deposition target areas. The method further comprises performing a dual-deposition process that deposits a plurality of layers on the photoresists and on the target areas. A conductive layer among the plurality of conductive layers inhibits X-ray energy so as to prevent damage to the underlying semiconductor substrate. The dual-deposition process tunes a first stress of the conductive layer and a tunes a second stress of at least one second layer among the plurality of layers independently from the first stress.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the disclosure are apparent from the following detailed description taken in conjunction with the accompanying drawings in which:

Figure 1:
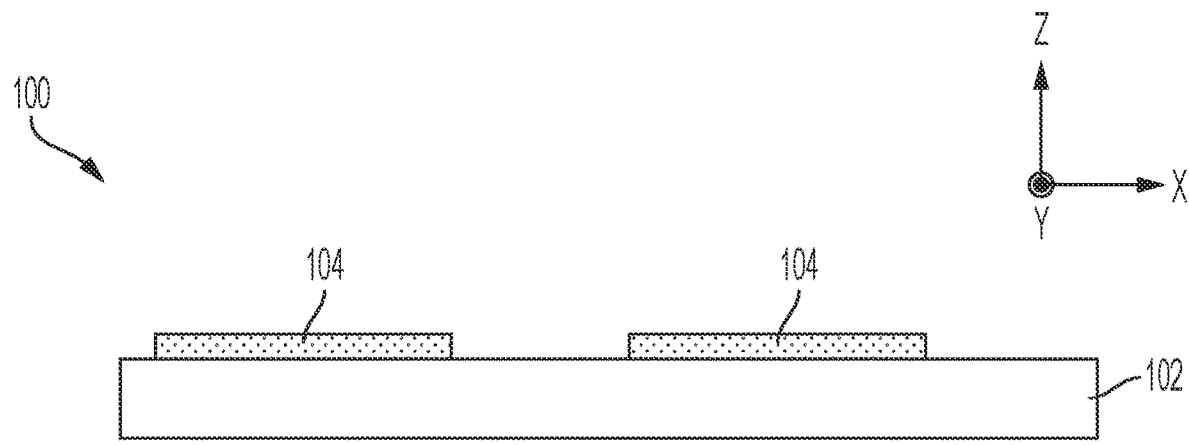
FIG. 1 depicts an intermediate IC according to a non-limiting embodiment.

The diagrams depicted herein are illustrative. There can be many variations to the diagram or the operations described therein without departing from the spirit of the disclosure. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the present disclosure are described herein with reference to the related drawings. Alternative embodiments can be devised without departing from the scope of this disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present disclosure will now be provided. Although specific fabrication operations used in implementing one or more embodiments of the present disclosure can be individually known, the described combination of operations and/or resulting structures of the present disclosure are unique. Thus, the unique combination of the operations described in connection with the fabrication of a semiconductor device or IC utilize a variety of individually known physical and chemical processes performed on a semiconductor (e.g., silicon) substrate, some of which are described in the immediately following paragraphs.

In general, the various processes used to form semiconductor devices that will be packaged into a micro-chip or IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation.

The aforementioned doping processes can be followed by a thermal anneal process such as, for example, furnace annealing or rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed using a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the disclosure, shadow mask deposition is desirable because it may eliminate the need to perform additional patterning processes after the pattern of resist material is formed on the underlying surface. In addition, the shadow mask itself can be positioned a distance away from the target surface so as to avoid directly contact the target surface and possibly damaging the underlying semiconductor device and/or substrate. However, the accuracy of the pattern transfer from the intervening shadow mask to the underlying substrate depends on many parameters. The material diffusion on the substrate (as a function of temperature, material type, evaporation angle, and distance between the substrate and shadow mask) along with the geometrical setup of the evaporation are factors that can lead to an unintentional enlargement of the initial pattern, typically referred to as blurring or feathering. Rather than defining precise outlines and boarders, the blurring or feathering produces an undesirable "halo effect" or "fringing effect" the reduces the accuracy and precision of the deposited pattern.

Photolithography avoids the halo-effect and its associated inaccuracies because the deposited material forming the thin-film layer directly contacts the targeted surface without first encountering an intervening masking element (e.g., shadow mask). However, radiated energy (e.g., X-rays) produced during the e-beam deposition process has been found to shift transistor turn on voltages in ROIC circuits. Whether this effect is problematic is circuit-specific and difficult to ascertain. Because a negative effect cannot be ruled out, manufactures may choose to employ shadow masks instead of photoresists alone when fabricating highly sensitive semiconductor substrates, such as hybrid semiconductor wafer and/or highly ICs such as, for example, a read out integrated circuit (ROIC).

Turning now to an overview of the aspects of the disclosure, one or more non-limiting embodiments of the disclosure address the above-described shortcomings of the prior art by providing an IC fabrication method that includes a dual-deposition process capable of protecting the underlying semiconductor substrate and/or semiconductor device from radiation (e.g., X-ray) damage. The dual-deposition process includes performing a first deposition process to deposit a first layer comprising a conductive material and subsequently performing a second deposition process to deposit one or more additional layers a comprising a conductive material on an upper surface of the first layer. The first deposition process is a non-X-ray deposition process such as, for example, a thermal deposition process or a sputtering process, either of which do not employ X-ray energy to deposit the metal material. The second deposition process, however, may employ X-ray energy to deposit the one or more additional conductive layers. However, the conductive layer attenuates the X-ray energy such that its energy is significantly reduced or even completely blocked from reaching the underlying semiconductor device and/or substrate. In this manner, underlying device alterations (e.g., shifts in transistor turn on voltages) and/or damage to the underlying semiconductor substrate is avoided.

With reference now to FIG. 1, an intermediate integrated circuit (IC) 100 is illustrated following one or more processing operations according to one or more embodiments of the disclosure. In the present specification and claims, an "intermediate" IC is defined as an IC in a stage of fabrication prior to a final stage. The intermediate IC 100 extends along a first axis (e.g., an X-axis) to define a horizontal length, a second axis (e.g., a Y-axis) orthogonal to the first axis to define a horizontal width, and a third axis (e.g., a Z-axis) orthogonal to the first and second axes to define a vertical height.

The intermediate IC 100 comprises a semiconductor substrate 102 including one or more semiconductor device 104 formed or bonded thereon. The semiconductor substrate 102 can be formed of various materials including, but not limited to, silicon (Si), silicon germanium (SiGe). The semiconductor device 104 can include a wide variety of semiconductor devices including but not limited to, infrared (IR) energy detectors and ultraviolet (UV) energy detectors, along with the transistors used to construct the detectors. Although 2 semiconductor devices 104 are shown, it should be appreciated that more or less semiconductor devices 104 can be formed on the semiconductor substrate 102 without departing from the scope of the invention.

Figure 2:
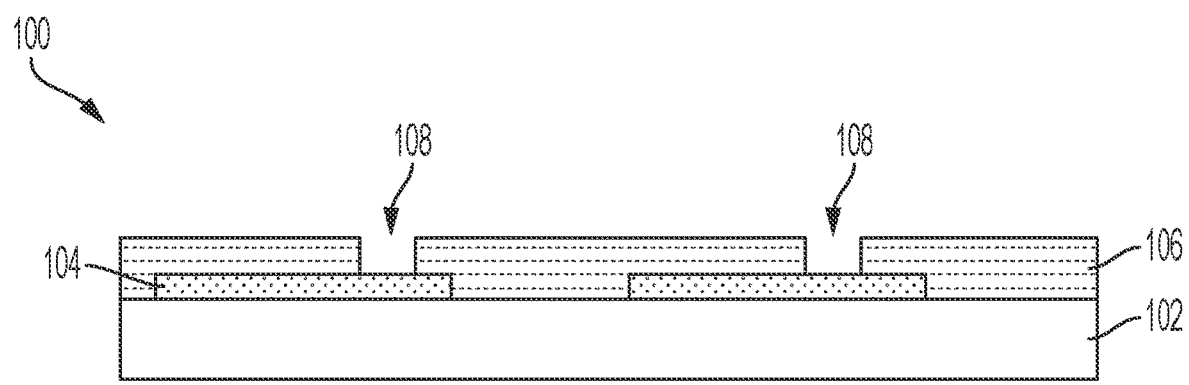
FIG. 2 depicts the IC after depositing a photoresist layer according to a non-limiting embodiment.

Turning to FIG. 2, the IC 100 is illustrated following deposition of a photoresist layer 106 according to a non-limiting embodiment. Various known light sensitive polymers and deposition techniques used according to standard semiconductor lithography processes can be employed. In one or more non-limiting embodiments, the photoresist layer 106 can be patterned according to known lithography techniques to form one or more voids 108. The voids 108 expose a portion of the underlying semiconductor device 104, while the remaining photoresist 106 covers the remaining portions of the semiconductor device 104. Although two voids are shown, it should be appreciated that more or less voids 108 can be patterned into the photoresist 106 without departing from the scope of the invention.

Figure 3:
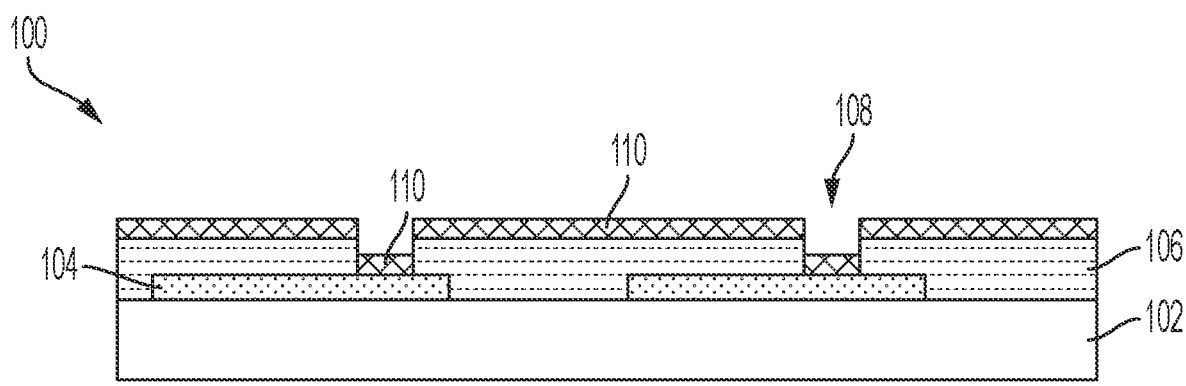
FIG. 3 depicts the IC after depositing a conductive layer on an upper surface of the photoresist layer according to a non-limiting embodiment.

Referring now to FIG. 3, the IC 100 is illustrated after depositing a conductive layer 110 on an upper surface of the photoresist layer 106 according to a non-limiting embodiment. The conductive layer 110 includes various conductive or metal materials, and is deposited using a non-X-ray deposition process. That is, the conductive layer 110 is deposited using a deposition process that does not expose the semiconductor device to significant radiation.

In one or more non-limiting embodiments, the conductive layer 110 is deposited using, for example, physical vapor deposition (PVD), which includes, but is not limited to, thermal evaporation deposition (TED) and sputtering. TED involves evaporating a source material in a vacuum, which allows vapor particles to travel directly to the target object e.g., the IC 100, where they condense back to a solid state to form the a deposited thin-film, or in this case the conductive layer 110. Sputtering involves ejecting the material (e.g., electrically conductive material) onto a target area such as the semiconductor substrate 102. In either deposition technique, X-rays are not present and are not directed toward the IC 100.

Still referring to FIG. 3, the deposited conductive layer 110 is formed directly on the upper surface of the photoresist 106 and also directly on the upper surface of a portion of the semiconductor device 104 exposed by a respective void 108. The deposited conductive layer 110 can have a thickness (e.g., extending vertically along the Z-axis) that is sufficient to significantly attenuate X-ray energy, or in some cases completely block X-ray energy from passing completely therethrough and reaching the underlying semiconductor device 104 and/or substrate 102. In one or more non-limiting embodiments, the conductive layer has a thickness ranging, for example, from about 100 nm to about 1000 nm. This exemplary range, however, is not limiting and it should be appreciated that other thicknesses capable of protecting the underlying semiconductor device 104 and/or substrate 102 from X-ray energy can be employed.

Figure 4:
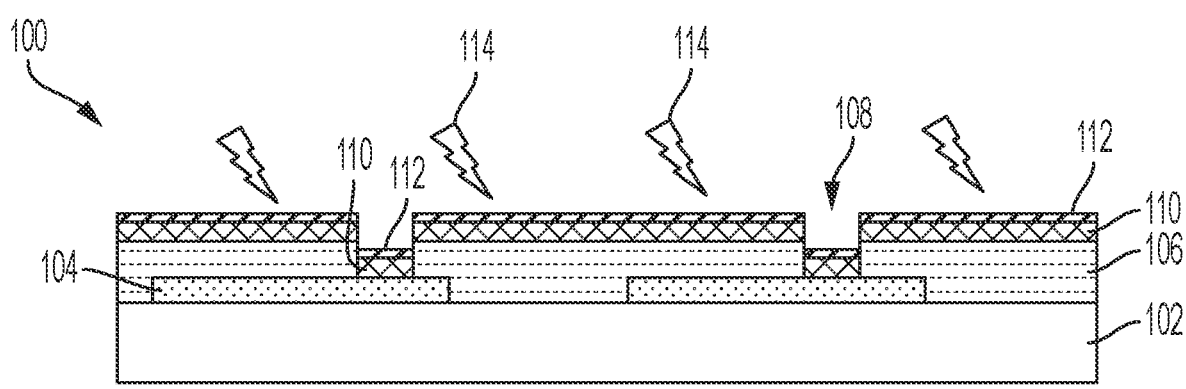
FIG. 4 depicts the IC after depositing a second layer on an upper surface of the conductive layer according to a non-limiting embodiment.

With reference to FIG. 4, the IC 100 is illustrated after depositing a one or more additional layers 112 on the upper surface of the conductive layer 110 according to a non-limiting embodiment. The additional layer(s) 112 can include various conductive or metal materials. In some embodiments, the additional layer(s) 112 can include a combination of metals and non-conductive materials (e.g., non-conductive glasses, insulating materials, etc.). Although a single additional layer 112 is shown, it should be appreciated that several additional deposited layers 112 can be deposited on the conductive layer 110 without departing from the scope of the invention. In one or more non-limiting embodiments, the additional layer(s) 112 is the same material as the conductive layer 110. Unlike the conductive layer 110, however, the additional layer(s) 112 is deposited using an electron beam (e-beam) deposition process such as, for example, e-beam physical vapor deposition (EBPVD).

In EBPVD, an electron source (sometimes referred to as an electron gun) directs an e-beam toward a target surface (e.g., the conductive layer 110). The e-beam causes atoms from the surface to transform into a gaseous phase. These atoms then precipitate into solid form, coating the exposed surfaces in the vacuum chamber with a thin-film material such as, for example, a second conductive layer. Upon striking the conductive layer 110, the electrons included in the e-beam lose their energy very rapidly. Some of the incident electron energy is lost through the production of X-rays 114 and secondary electron emission. However, the conductive layer 110 has a sufficient thickness that blocks the X-rays from passing therethrough and reaching the underlying semiconductor device 104 and/or substrate 102, or at the very least sufficiently attenuates the radiation levels of the X-rays 114 such that they do not adversely affect the substrate 102 and/or the semiconductor device 10. In either case, the X-rays are unable to damage the underlying semiconductor device 104 and/or substrate 102 nor alter device characteristics (e.g., shifts in transistor turn on voltages) of the semiconductor device 104.

Conventional deposition processes use a single deposition system. However, the stress of deposited coatings may change with a particular deposition method and the surrounding conditions. The change in stress in turn changes the crystal structure slightly. In a single deposition method, may be less freedom to tune layer stress, resulting in a less reliable coating.

In one or more non-limiting embodiments, the materials of the conductive layer 110 and the second deposited layer(s) 114 are depositing using two different deposition systems, i.e., a first deposition system that does not does not deliver electron beams when depositing the initial conductive material and a different second system that delivers electron beams when depositing the additional conductive material. Because two different and separate systems can be employed, the system can be independently tuned to balance the overall stress of the initial conductive layer and the additional conductive layers. For example, a first evaporation rate, first sputter rate, and/or first heating rate at which the conductive material is deposited can be set using the first deposition system and a second evaporation rate, second sputter rate, and/or second heating rate at which the second deposited material (i.e., of the second layer(s) 114) is deposited can be set using the second deposition system independently from the first evaporation rate, first sputter rate, and/or first heating rate. In this manner, the resulting stress of the conductive layer 110 can be tuned independently from the resulting stress of the additional conductive layer(s) 114.

Still referring to FIG. 4, the deposited second layer(s) 112 is formed directly on the upper surface of the conductive layer 110, including the portion of the conductive layer 110 formed on the semiconductor device 104 and exposed by the void 108. The deposited second layer 112 can have a thickness (e.g., extending vertically along the Z-axis) ranging, for example, from about 50 nm to about 5000 nm.

Figure 5:
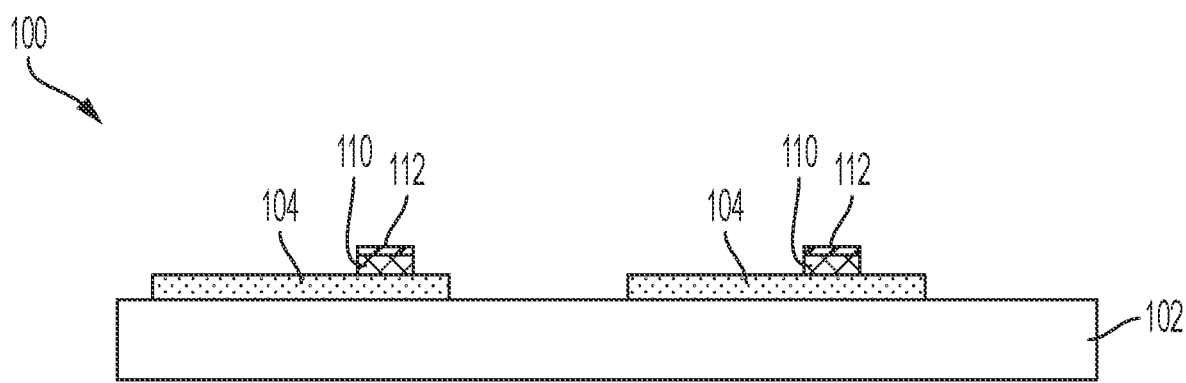
FIG. 5 depicts the IC following removal of photoresist layer, the conductive layer, and the second layer according to a non-limiting embodiment.

Turning now to FIG. 5, the IC 100 is illustrated following removal of photoresist layer 106, the conductive layer 110, and the second layer 112 according to a non-limiting embodiment. In one or more non-limiting embodiments, targeted portions of the photoresist layer 106, conductive layer 110, and second layer 112 can be stripped away from the IC 100 by applying a wet etchant or a stripping solution such as an acetone wash, for example, thereto.

For example, a wet etchant can be applied to the photoresist layer 106, conductive layer 110, and second layer 112, with the exception of the portions of the conductive layer 110, and second layer 112 formed in the void 108 (see FIG. 4). Accordingly, the portions of the conductive layer 110, and second layer 112 contacted by to the wet etchant are stripped away so as to expose the underlying semiconductor device 104, while portions of the conductive layer 110, and second layer 112 previously located in the void 108 remain formed on the upper surface of the semiconductor device 104 as shown in FIG. 5. Accordingly, an IC 100 is fabricated using, in part, one or more e-beam deposition processes, while also excluding underlying device alterations (e.g., shifts in transistor turn on voltages) and/or damage to the underlying semiconductor substrate.

Figure 6:
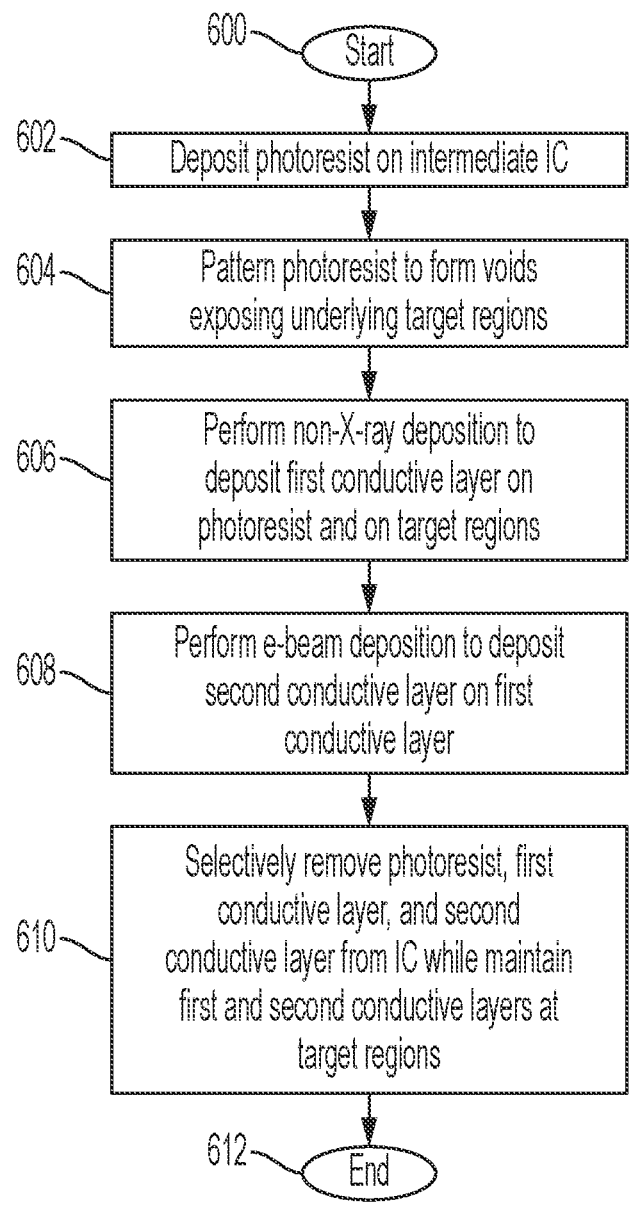
FIG. 6 is a flow diagram illustrating a method of fabricating an IC according to a non-limiting embodiment.

Referring now FIG. 6, a method of fabricating an IC is illustrated according to a non-limiting embodiment. The method begins at operation 600 and at operation 602, a photoresist is deposited on an IC. The photoresist can cover portions of semiconductor substrate and/or portions of one or more semiconductor devices formed on the substrate. At operation 604, the photoresist is patterned to form one or more voids therein. The voids expose portions of the underlying semiconductor substrate and/or semiconductor device(s). These exposed portions define target regions at which to deposit a material using the dual-deposition process. The dual-deposition process deposits materials to form a plurality of layers on the photoresists and on target areas of the underlying semiconductor substrate and/or semiconductor device. However, at least one of the layers among the plurality of layers formed during the dual-deposition process inhibits X-ray energy so as to prevent damage to the underlying semiconductor substrate and/or semiconductor device as described further below.

Turning to operation 606, a non-X-ray deposition process is performed. The non-X-ray deposition process deposits a conductive layer on the upper surface of the photoresist layer and also on the target regions, i.e., the upper surface of the semiconductor substrate and/or semiconductor device(s) exposed by the voids. At operation 608, an e-beam deposition process is performed. The e-beam deposition process deposits a one or more layers of material on the upper surface of the conductive material, including the portion of the conductive material formed at the target regions. At operation 610, portions of the photoresist, conductive layer and layer(s) are selectively removed from IC, while portions of the conductive layer and the second layer(s) are maintained at the target areas. The method ends at operation 612 such that an IC is provided using, in part, one or more e-beam deposition processes, while also excluding underlying device alterations (e.g., shifts in transistor turn on voltages) and/or damage to the underlying semiconductor substrate and/or semiconductor device(s).

As described above, various non-limiting embodiments of the disclosure provide a dual-deposition process capable of protecting the underlying semiconductor substrate and/or semiconductor device from radiation (e.g., X-ray) damage. The dual-deposition process includes performing a first deposition process to deposit a first layer comprising a conductive material and subsequently performing a second deposition process to deposit one or more additional layers a comprising a conductive material on an upper surface of the first layer. The first deposition process is a non-X-ray deposition process such as, for example, a thermal deposition process or a sputtering process, either of which do not employ X-ray energy to deposit the conductive material. The second deposition process, however, may employ X-ray energy to deposit the one or more additional conductive layers. However, the conductive layer attenuates the X-ray energy such that its energy is significantly reduced or even completely blocked from reaching the underlying semiconductor device and/or substrate. In this manner, underlying device alterations (e.g., shifts in transistor turn on voltages) and/or damage to the underlying semiconductor substrate is avoided.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

Aspects of the present disclosure are described herein with reference to flowchart illustrations and/or block diagrams of methods, and apparatus (devices) products according to embodiments of the disclosure. The flowchart and block diagrams in the Figures illustrate the architecture, functionality, and operation of possible implementations of the device and method of fabricating the device according to various embodiments of the present disclosure. In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or a unique combination of fabrication operations to fabricate the semiconductor device.

The present disclosure may be a device and/or method of fabricating the device at any possible technical detail level of integration. The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating an integrated circuit (IC), the method comprising:
    depositing a photoresist on a semiconductor substrate;
    patterning the photoresist to expose one or more deposition target areas; and
    performing a dual-deposition process that deposits material to form a plurality of layers on the photoresist and on the one or more deposition target areas, wherein a conductive layer among the plurality of layers inhibits X-ray energy to prevent damage to the underlying semiconductor substrate; and
    selectively removing first portions of the photoresist and first portions of the plurality of layers from the semiconductor substrate, while maintaining second portions of the plurality of layers at the one or more deposition target areas;
    wherein the dual-deposition process comprises:
    performing a first deposition process that forms the conductive layer on the semiconductor substrate; and
    performing a second deposition process that forms at least one second layer on an upper surface of the conductive layer;
    wherein the conductive layer reduces an energy level of X-rays passing therethrough during the second deposition process.

2. The method of claim 1, wherein the conductive layer completely blocks the energy level of the X-rays present during the second deposition process from passing therethrough.

3. The method of claim 1, wherein the first deposition process includes a thermal vapor deposition (TVD) process or a sputtering process, and wherein the second deposition process is an electron beam (e-beam) deposition process.

4. The method of claim 3, wherein the conductive layer comprises a metal material, and the at least one second layer comprises one or both of a conductive material and a non-conductive material.

5. The method of claim 3, further comprising:
    forming at least one semiconductor device on an upper surface of the semiconductor substrate prior to depositing the photoresist; and
    performing the e-beam deposition process to form the at least one second layer, while inhibiting the X-ray energy via the conductive layer from reaching the semiconductor substrate to avoid damaging the semiconductor substrate.

6. A method of fabricating an integrated circuit (IC), the method comprising:
    depositing a photoresist on a semiconductor substrate;
    patterning the photoresist to expose one or more deposition target areas; and
    performing a dual-deposition process that deposits a plurality of layers on the photoresist and on the one or more deposition target areas, wherein a conductive layer among the plurality of layers inhibits X-ray energy to prevent damaging the semiconductor substrate
    wherein the dual-deposition process tunes a first stress of the conductive layer and a second stress of at least one second layer among the plurality of layers independently from the first stress.

7. The method of claim 6, further comprising selectively removing first portions of the photoresist, first portions of the plurality of layers from the semiconductor substrate, while maintaining second portions of the plurality of layers at the one or more deposition target areas.

8. The method of claim 7, wherein the dual-deposition process comprises:
performing a first deposition process that forms the conductive layer on the semiconductor substrate having the first stress; and
performing a second deposition process that forms the at least one second layer having the second stress on an upper surface of the conductive layer
wherein the conductive layer reduces an energy level of X-rays passing therethrough during the second deposition process.

9. The method of claim 8, wherein the conductive layer completely blocks the energy level of X-rays present during the second deposition process from passing therethrough.

10. The method of claim 8, wherein the first deposition process includes a thermal vapor deposition (TVD) process or a sputtering process.

11. The method of claim 10, and wherein the second deposition process is an electron beam (e-beam) deposition process.

12. The method of claim 10, wherein the conductive layer comprises a metal material and the at least one second layer comprises one or both of a conductive material and a non-conductive material.

13. The method of claim 10, further comprising:
forming at least one semiconductor device on an upper surface of the semiconductor substrate prior to depositing the photoresist; and
performing the e-beam deposition process to form the at least one second layer, while inhibiting the X-ray energy via the conductive layer from reaching the semiconductor substrate and the at least one semiconductor device to avoid damaging the semiconductor substrate and the at least one semiconductor device.

* * * * *